United States Patent
Kagaya et al.

(10) Patent No.: US 12,374,543 B2
(45) Date of Patent: Jul. 29, 2025

(54) RECESS FILLING METHOD AND SUBSTRATE PROCESSING APPARATUS

(71) Applicant: Tokyo Electron Limited, Tokyo (JP)

(72) Inventors: Munehito Kagaya, Yamanashi (JP); Yusuke Suzuki, Yamanashi (JP)

(73) Assignee: TOKYO ELECTRON LIMITED, Tokyo (JP)

(*) Notice: Subject to any disclaimer, the term of this patent is extended or adjusted under 35 U.S.C. 154(b) by 317 days.

(21) Appl. No.: 18/028,262

(22) PCT Filed: Sep. 21, 2021

(86) PCT No.: PCT/JP2021/034622
§ 371 (c)(1),
(2) Date: Mar. 24, 2023

(87) PCT Pub. No.: WO2022/065315
PCT Pub. Date: Mar. 1, 2022

(65) Prior Publication Data
US 2023/0377876 A1 Nov. 23, 2023

(30) Foreign Application Priority Data

Sep. 28, 2020 (JP) .................................. 2020-161800

(51) Int. Cl.
*H01L 21/02* (2006.01)
*H01L 21/311* (2006.01)
(52) U.S. Cl.
CPC ...... *H01L 21/0228* (2013.01); *H01L 21/0217* (2013.01); *H01L 21/31116* (2013.01)

(58) Field of Classification Search
None
See application file for complete search history.

(56) References Cited

U.S. PATENT DOCUMENTS 9,005,459 B2 * 4/2015 Kakimoto ........... H01J 37/3244
216/37
2022/0238374 A1 * 7/2022 Motoyama ........ H01L 21/32137

FOREIGN PATENT DOCUMENTS

JP 2007-335807 A 12/2007
JP 2014-112668 A 6/2014

* cited by examiner

*Primary Examiner* — Roberts P Culbert
(74) *Attorney, Agent, or Firm* — Nath, Goldberg & Meyer; Jerald L. Meyer; Tanya E. Harkins (57) ABSTRACT

A recess filling method includes a combined process including a film formation process of forming a film in recesses formed on the surface of a substrate and having different aspect ratios, and an etching process of etching the film formed in the recesses; and a repetition process of repeating the combined process n times (n is a natural number of 2 or more), wherein the repetition process includes: a first combined process of performing the etching process with a first etching amount suitable for filling, with the film, a first recess having a first aspect ratio; and a second combined process of performing the etching process with a second etching amount that is smaller than the first etching amount and is suitable for filling, with the film, a second recess having a second aspect ratio lower than the first aspect ratio.

20 Claims, 11 Drawing Sheets

RECESS FILLING METHOD AND SUBSTRATE PROCESSING APPARATUS

This is a National Phase Application filed under 35 U.S.C. 371 as a national stage of PCT/JP2021/034622, filed Sep. 21, 2021, an application claiming the benefit of Japanese Application No. 2020-161800, filed Sep. 28, 2020, the content of each of which is hereby incorporated by reference in its entirety.

TECHNICAL FIELD

The present disclosure relates to a recess filling method and a substrate processing apparatus.

BACKGROUND

As a conventional method of depositing a dielectric oxide in a gap having a high aspect ratio, in order to avoid formation of a void, a deposition method of repeating a deposition-etching-deposition cycle one or more times to fill the gap is known (see, for example, Patent Document 1).

In addition, there is known a semiconductor device manufacturing method including: introducing liquid phase silanol until, among a plurality of recesses provided on a substrate and having different aspect ratios, a first recess having an aspect ratio of a predetermined value or more is filled with the liquid-phase silanol and introducing the silanol to a middle portion of a second recess having an aspect ratio less than the predetermined value; converting the silanol into a silicon oxide film through dehydration condensation; and further filling another insulating film in the second recess (see, for example, Patent Document 2).

PRIOR ART DOCUMENTS

Patent Documents

Patent Document 1: Japanese Patent Laid-Open Publication No. 2014-112668
Patent Document 2: Japanese Patent Laid-Open Publication No. 2007-335807

The present disclosure proposes voidlessly filling, with a film, recesses having different aspect ratios.

SUMMARY

In order to achieve the above-described goal, a recess filling method according to an aspect of the present disclosure includes: a combined process including a film formation process of forming a film in recesses formed on a surface of a substrate and having different aspect ratios, and an etching process of etching the film formed in the recesses; and a repetition process of repeating the combined process n times (n is a natural number of 2 or more), wherein the repetition process includes: a first combined process of performing the etching process with a first etching amount suitable for filling, with the film, a first recess having a first aspect ratio; and a second combined process of performing the etching process with a second etching amount that is smaller than the first etching amount and is suitable for filling, with the film, a second recess having a second aspect ratio lower than the first aspect ratio.

According to the present disclosure, recesses having different aspect ratios can be voidlessly filled.

DETAILED DESCRIPTION

Hereinafter, embodiments for implementing the present disclosure will be described with reference to drawings.

[Substrate Processing Apparatus]

Figure 1:
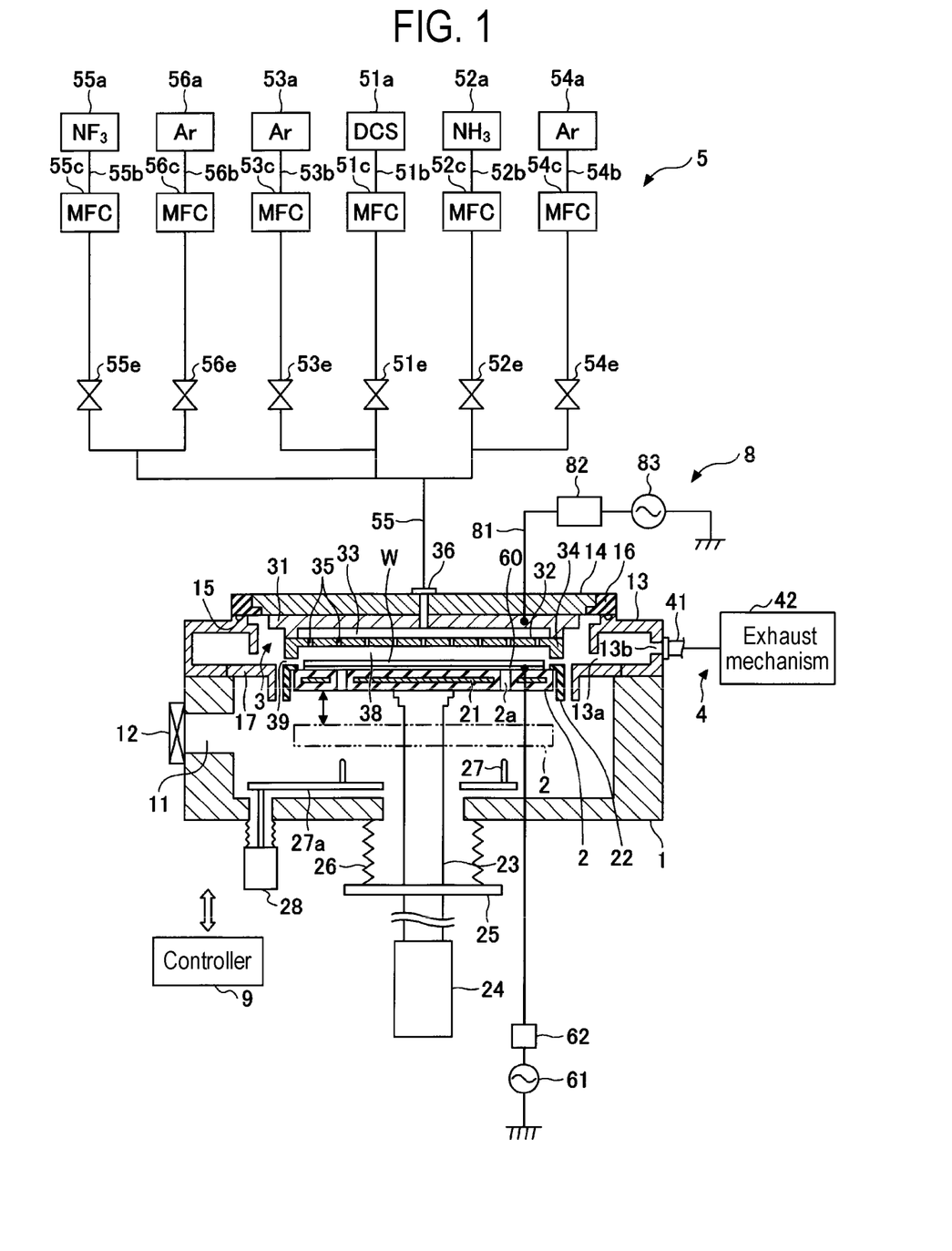
FIG. 1 is a schematic view illustrating a configuration example of a substrate processing apparatus according to an embodiment of the present disclosure.

FIG. 1 is a schematic view illustrating an exemplary configuration of a substrate processing apparatus according to an embodiment of the present disclosure. A recess filling method according to an embodiment of the present disclosure may be implemented by substrate processing apparatuses having various structures as long as the apparatuses are capable of performing both film formation and etching. In the present embodiment, a substrate processing apparatus for forming a SiN film by a plasma-enhanced atomic layer deposition (PE-ALD) method in a processing container under a pressure-reduced state will be described as an example.

As illustrated in FIG. 1, a substrate processing apparatus includes a processing container 1, a stage 2, a shower head 3, an exhauster 4, a gas supply mechanism 5, an RF power supply 8, and a controller 9.

The processing container 1 is made of a metal such as aluminum and has a substantially cylindrical shape. The processing container 1 accommodates a wafer W. A carry-in/out port 11 is formed in the side wall of the processing container 1 to perform carry-in/out of a wafer W therethrough and opened/closed by a gate valve 12. An annular exhaust duct 13 having a rectangular cross section is provided on the main body of the processing container 1. A slit 13a is formed along the inner peripheral surface of the exhaust duct 13. An exhaust port 13b is formed in the outer wall of the exhaust duct 13. On the top surface of the exhaust duct 13, a ceiling wall 14 is provided to close the upper opening of the processing container 1 via an insulating member 16. The space between the exhaust duct 13 and the insulating member 16 is hermetically sealed with a seal ring 15. A partition member 17 divides the interior of the processing container 1 into upper and lower portions when the stage 2 (and a cover member 22) is raised to a processing position which will be described later.

The stage 2 horizontally supports the wafer W in the processing container 1. The stage 2 is formed in a disk shape having a size corresponding to the wafer W and supported by a support member 23. The stage 2 is formed of a ceramic material such as AlN or a metal material such as aluminum or nickel alloy, and a heater 21 for heating a wafer W is embedded in the stage 2. The heater 21 generates heat by being fed with power from a heater power source (not illustrated). Then, the wafer W is controlled to a predetermined temperature by controlling the output of the heater 21 by a temperature signal of a thermocouple (not illustrated) provided in the vicinity of the top surface of the stage 2. The stage 2 is provided with a cover member 22 formed of ceramics such as alumina to cover the outer peripheral region of the top surface and the side surface thereof.

The stage 2 is also provided with a lower electrode 60. A radio-frequency power source 61 is connected to the lower electrode 60 via a matcher 62. The radio-frequency power source 61 generates a first radio-frequency power. The first radio-frequency power is used as bias radio-frequency power for attracting ions to the substrate W. The radio-frequency power source 61 is not essential, and the lower electrode 60 may be grounded.

A support member 23 configured to support the stage 2 is provided under the stage 2. The support member 23 extends to the lower side of the processing container 1 through an opening portion formed through the bottom wall of the processing container 1 from the center of the bottom surface of the stage 2, and the lower end of the support member 23 is connected to a lifting mechanism 24. The stage 2 is raised and lowered via the support member 23 by the lifting mechanism 24 between a processing position illustrated in FIG. 1 and a transport position at which a wafer W is transportable, wherein the transport position is indicated by the alternate long and two short dashes line below the processing position. A flange 25 is provided on the support member 23 below the processing container 1, and a bellows 26, which partitions the atmosphere in the processing container 1 from the outside air, is provided between the bottom surface of the processing container 1 and the flange 25 to expand/contract in response to the raised/lowered movement of the stage 2.

Three wafer support pins 27 (of which only two are illustrated) are provided in the vicinity of the bottom surface of the processing container 1 to protrude upward from a lifting plate 27a. The wafer support pins 27 are raised and lowered via the lifting plate 27a by a lifting mechanism 28 provided below the processing container 1. The wafer support pins 27 are inserted through through-holes 2a formed in the stage 2 when the stage 2 is located at the transport position and are configured to protrude and retreat with respect to the top surface of the stage 2. By raising/lowering the wafer support pins 27, the wafer W is delivered between a transport mechanism (not illustrated) and the stage 2.

The shower head 3 supplies a processing gas into the processing container 1 in a shower form. The shower head 3 is made of a metal, is provided to face the stage 2, and has a diameter that is substantially the same as that of the stage 2. The shower head 3 includes a main body 31 fixed to the ceiling wall 14 of the processing container 1 and a shower plate 32 connected to the lower side of the main body 31. A gas diffusion space 33 is formed between the main body 31 and the shower plate 32. The gas diffusion space 33 is provided with a gas introduction hole 36 to penetrate the centers of the ceiling wall 14 and the main body 31 of the processing container 1. An annular protrusion 34 protruding downward is formed on the peripheral edge of the shower plate 32. Gas ejection holes 35 are formed in the flat surface inside the annular protrusion 34. In a state in which the stage 2 is present at the processing position, a processing space 38 is formed between the stage 2 and the shower plate 32, and the top surface of the cover member 22 and the annular protrusion 34 are close to each other to form an annular gap 39.

The exhauster 4 evacuates the interior of the processing container 1. The exhauster 4 includes an exhaust pipe 41 connected to the exhaust port 13b, and an exhaust mechanism 42 connected to the exhaust pipe 41 and including a vacuum pump, a pressure control valve, or the like. During processing, the gas in the processing container 1 reaches the exhaust duct 13 via the slit 13a and is exhausted from the exhaust duct 13 through the exhaust pipe 41 by the exhaust mechanism 42.

The gas supply mechanism 5 supplies the processing gas into the processing container 1. The gas supply mechanism 5 includes a precursor gas source 51a, a reaction gas source 52a, an Ar gas source 53a, an Ar gas source 54a, an etching gas source 55a, and an Ar gas source 56a.

In the gas supply mechanism 5, the precursor gas source 51a, the reaction gas source 52a, the Ar gas source 53a, and the Ar gas source 54a are gas supply mechanisms for film formation.

The precursor gas source 51a supplies a precursor gas into the processing container 1 through a gas supply line 51b. In the example illustrated in FIG. 1, dichlorosilane (DCS) gas is used as a precursor gas. The gas supply line 51b is provided with a flow rate controller 51c and a valve 51e from the upstream side. The downstream side of the valve 51e of the gas supply line 51b is connected to the gas introduction hole 36 via the gas supply line 55. The precursor gas supplied from the precursor gas source 51 a is supplied into the processing container 1. The supplying and stopping of the precursor gas to the processing container 1 are performed by opening and closing the valve 51e.

The reaction gas source 52a supplies a reaction gas into the processing container 1 through a gas supply line 52b. In the example illustrated in FIG. 1, NH$_3$ gas is used as a reaction gas. The gas supply line 52b is provided with a flow rate controller 52c and a valve 52e from the upstream side. The downstream side of the valve 52e of the gas supply line 52b is connected to the gas introduction hole 36 via the gas supply line 55. The reaction gas supplied from the reaction gas source 52a is supplied into the processing container 1. The supplying and stopping of the reaction gas to the processing container 1 are performed by opening/closing the valve 52e.

The Ar gas source 53a supplies Ar gas as a purge gas into the processing container 1 through a gas supply line 53b. The gas supply line 53b is provided with a flow rate controller 53c and a valve 53e from the upstream side. The downstream side of the valve 53e of the gas supply line 53b is connected to the gas supply line 51b. The Ar gas supplied from the Ar gas source 53a is supplied into the processing container 1. The supplying and stopping of the Ar gas to the processing container 1 are performed by opening/closing the valve 53e.

The Ar gas source 54a supplies Ar gas as a purge gas into the processing container 1 through a gas supply line 54b. The gas supply line 54b is provided with a flow rate controller 54c and a valve 54e from the upstream side. The downstream side of the valve 54e of the gas supply line 54b is connected to the gas supply line 52b. The Ar gas supplied from the Ar gas source 54a is supplied into the processing container 1. The supplying and stopping of the Ar gas to the processing container 1 are performed by opening/closing the valve 54e.

In the gas supply mechanism 5, the etching gas source 55a and the Ar gas source 56a are gas supply mechanisms for etching.

The etching gas source 55a supplies an etching gas into the processing container 1 through a gas supply line 55b. In the example illustrated in FIG. 1, $NF_3$ gas is used as an etching gas. The gas supply line 55b is provided with a flow rate controller 55c and a valve 55e from the upstream side. The downstream side of the valve 55e of the gas supply line 55b is connected to the gas introduction hole 36 through the gas supply line 55. The $NF_3$ gas supplied from the etching gas source 55a is supplied into the processing container 1. The supplying and stopping of the $NF_3$ gas to the processing container 1 are performed by opening/closing the valve 55e.

The Ar gas source 56a supplies Ar gas into the processing container 1 through a gas supply line 56b. The gas supply line 56b is provided with a flow rate controller 56c and a valve 56e from the upstream side. The downstream side of the valve 56e of the gas supply line 56b is connected to the gas introduction hole 36 through the gas supply line 55. The Ar gas supplied from the Ar gas source 56a is supplied into the processing container 1. The supplying and stopping of the Ar gas to the processing container 1 are performed by the opening/closing of the valve 56e.

In the recess filling method according to the present embodiment, in order to alternately perform film formation and etching, both mechanisms for supplying a film forming gas and an etching gas are provided.

In addition, the processing apparatus 101 is a capacitively coupled plasma apparatus, in which the stage 2 serves as a lower electrode and the shower head 3 serves as an upper electrode. A radio-frequency power source is connected to the stage 2 serving as the lower electrode via a matcher. The radio-frequency power source is not essential, and the lower electrode may be grounded.

Radio-frequency power (hereinafter, also referred to as "RF power") is applied to the shower head 3 serving as the upper electrode by an RF power supply 8. The RF power supply 8 includes a feeding line 81, a matcher 82, and a radio-frequency power source 83. The radio-frequency power source 83 generates second radio-frequency power. The second radio-frequency power has a frequency suitable for plasma generation. The frequency of the radio-frequency power is a frequency in the range from 450 KHz in a low-frequency band to 2.45 GHz in a microwave band. The radio-frequency power source 83 is connected to the main body 31 of the shower head 3 via the matcher 82 and the feeding line 81. The matcher 82 includes a circuit for matching the output reactance of the radio-frequency power source 83 and the reactance of a load (the upper electrode). Although the RF power supply 8 has been described as applying radio-frequency power to the shower head 3 serving as the upper electrode, the present disclosure is not limited thereto. The RF power supply 8 may be configured to apply radio-frequency power to the stage 2 serving as the lower electrode.

The controller 9 is, for example, a computer and includes a central processing unit (CPU), a random-access memory (RAM), a read only memory (ROM), an auxiliary memory, and the like. The CPU operates based on a program stored in the ROM or the auxiliary memory and controls the operation of the processing apparatus 101. The controller 9 may be provided either inside or outside the processing apparatus 101. In the case where the controller 9 is provided outside the processing apparatus 101, the controller 9 may control the processing apparatus 101 via a wired or wireless communication means.

(Recess Filling Method)

Next, a recess filling method according to an embodiment of the present disclosure will be described.

Figure 2:
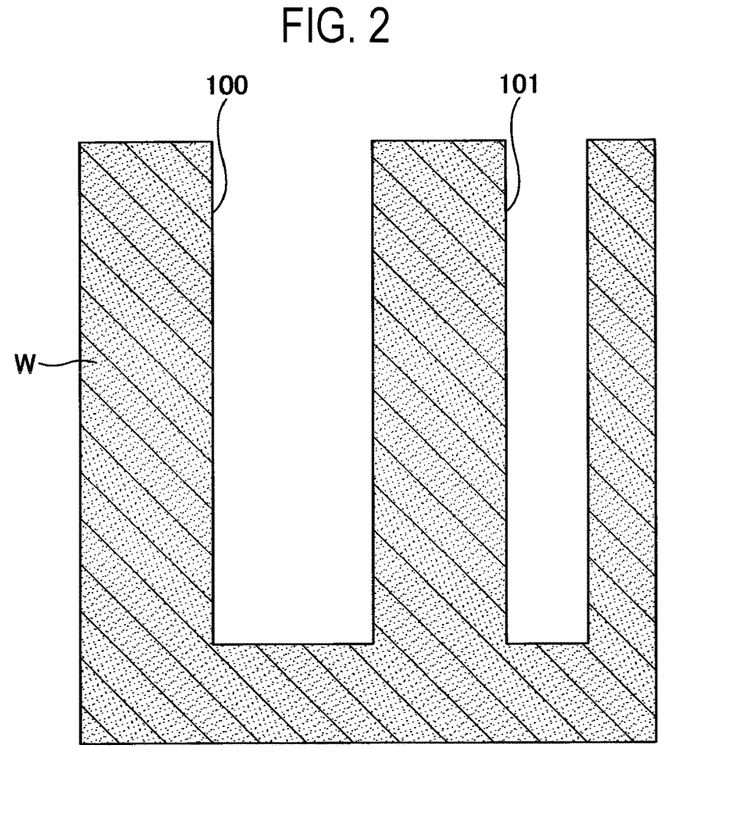
FIG. 2 is an explanatory view illustrating recesses to be filled by a recess filling method according to an embodiment.

FIG. 2 is a view for explaining recesses to be filled by the recess filling method according to the present embodiment. Recesses 100 and 101 are recesses formed on the surface of a wafer W and include groove-like trenches and through-hole contact holes. The recesses 100 and 101 also include irregularly shaped recesses. A silicon substrate is generally used for the wafer W, but other substrates are also applicable. In the present embodiment, an example in which the wafer W is a silicon wafer will be described.

As illustrated in FIG. 2, recesses 100 and 101 are formed on the surface of the wafer W, and the aspect ratios of the recesses 100 and 101 are different. That is, the aspect ratio of the recess 101 is higher than that of the recess 100. In recent years, there has been an increasing demand for filling, with a film, the recesses 100 and 101 having different aspect ratios on the surface of the same wafer W. This difference in aspect ratio may be intentionally provided or may be unintentional imbalance resulting from processing accuracy. In any case, it is required to fill the recesses 100 and 101 with a film without generating a void.

As a method of filling, with a film, a recess 101 having a high aspect ratio, a method of performing film formation, etching, and film formation is known. This is a method of filling the recess 101 with first film formation, then performing etching to widen the opening, and performing film formation again. This is a method for preventing the occurrence of a void and is an effective method of filling a recess 1010 having a high aspect ratio. That is, in the case of performing filling, when the upper end portion of the recess is blocked by a film in a state in which the film is not filled in the vicinity of the center, the filling is insufficient and a void occurs. In order to prevent the occurrence of such a void, after performing the filling, the opening is expanded by etching, and film formation is performed so that a film is filled from the bottom side.

Figure 3A:
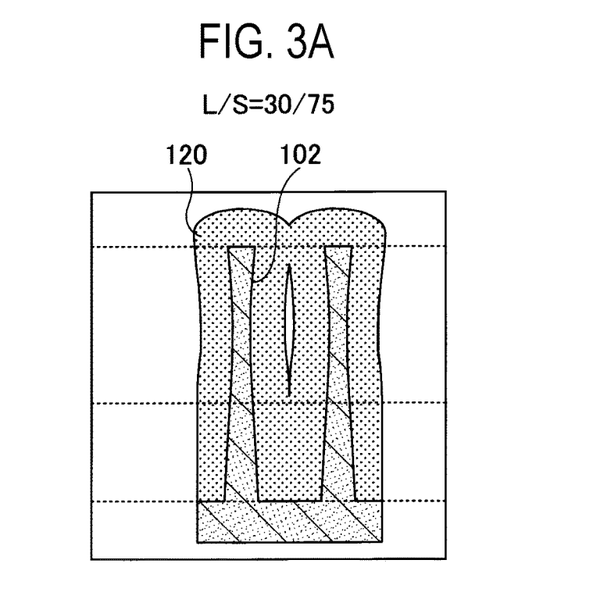
FIGS. 3A to 3D are views for explaining the filled states of recesses having different aspect ratios.
Figure 3B:
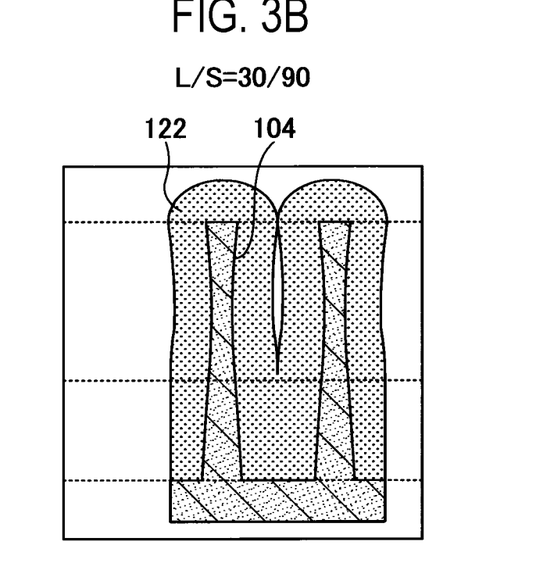
Figure 3C:
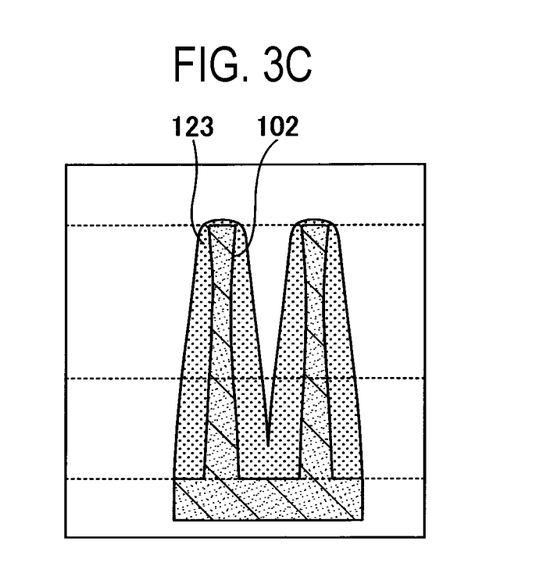
Figure 3D:
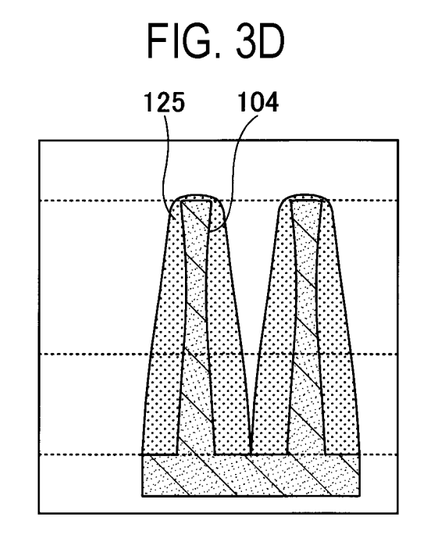

FIGS. 3A to 3D are views for explaining the filling states of recesses having different aspect ratios. FIGS. 3A and 3C illustrate a recess with line/space (L/S)=30/75, and FIGS. 3B and 3D illustrate a recess with line/space=30/90. The magnitude relationship in the aspect ratios between the recesses is as follows: FIGS. 3B and 3D<FIGS. 3A and 3C.

FIGS. 3A and 3B illustrate the states after only filling is performed, and FIGS. 3C and 3D illustrate the states after filling is performed and then etching is performed.

FIGS. 3A and 3B illustrate the states after only filling is completed. Although the recesses 102 and 104 differ from each other in L/S, voids are formed in both of them.

On the other hand, in FIGS. 3C and 3D, when comparing a film 123 of FIG. 3C and a film 125 of FIG. 3D, the post-etching shape (V shape) in a very center of the film 123 in FIG. 3C does not reach a bottom surface of the recess 102.

However, the post-etching shape (V shape) in the middle of the film 125 in FIG. 3D reaches the bottom surface of the recess 104.

That is, in a pattern having a wide opening width and a low aspect ratio, film reduction due to etching becomes larger than in a pattern having a high aspect ratio, and as a result, the final remaining film amount is reduced. Therefore, when performing processing under etching conditions suitable for a pattern having a high aspect ratio, the recess 104 of the pattern of the low aspect ratio may be exposed and damaged. In contrast, when performing processing under etching conditions suitable for a pattern having a low aspect ratio, there is a possibility that the amount of etching for a pattern having a high aspect ratio may be insufficient and void formation may not be sufficiently suppressed.

Figure 4A:
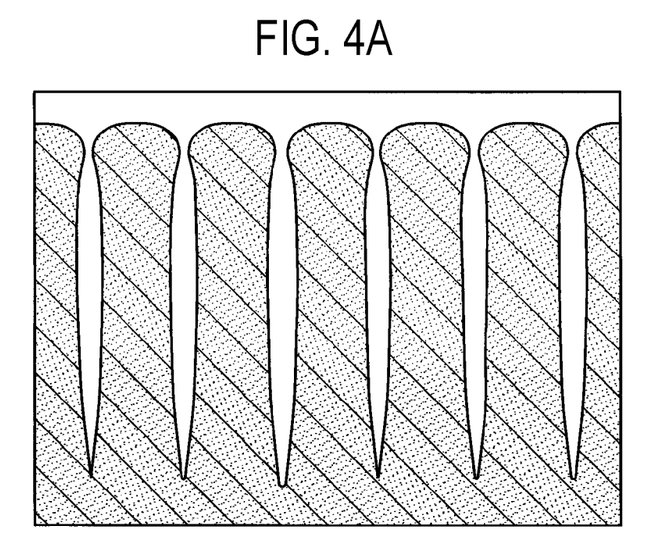
FIGS. 4A and 4B are views illustrating the states in which film formation and etching have been performed on a wafer in which recesses having different aspect ratios are formed.
Figure 4B:
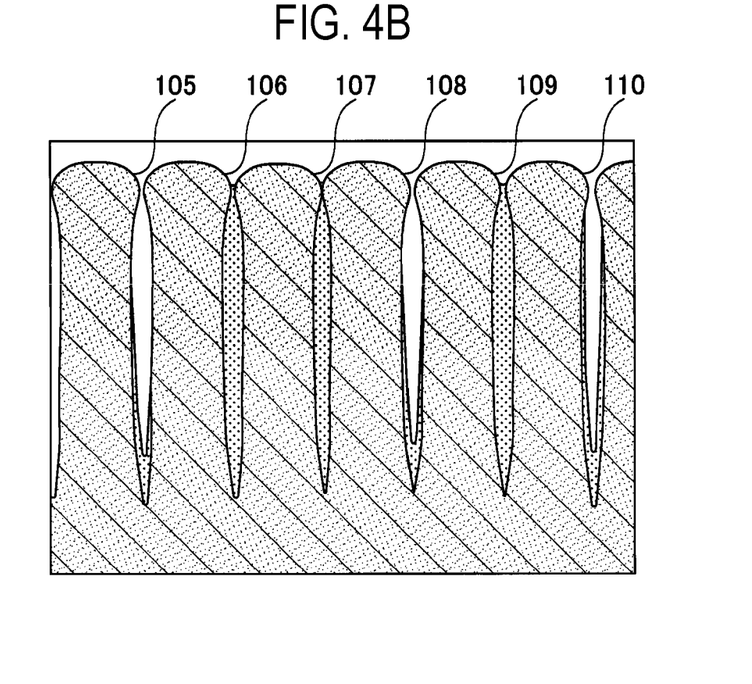

FIGS. 4A and 4B are views illustrating states in which film formation and etching have been performed on a wafer, wherein recesses 102 and 104 having different aspect ratios as illustrated in FIGS. 3A and 3B are formed.

As illustrated in FIGS. 4A and 4B, when a filling is performed from the initial state and etching is performed, recesses 106, 107, and 109 filled with a film and recesses 105, 108, and 110 not filled with a film occur. It can be seen that if the pattern sizes of recesses 105 to 110 are uneven, a difference in filling occurs.

Figure 5:
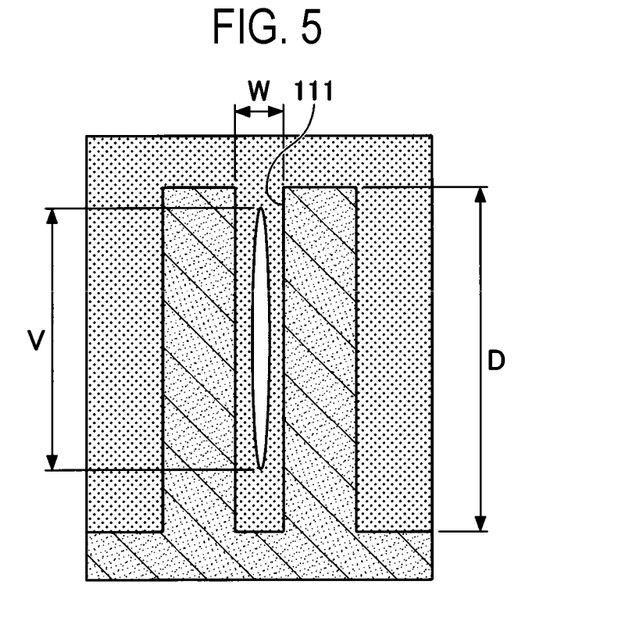
FIG. 5 is a view illustrating indices indicating the sizes of a recess and a void.

FIG. 5 is a view illustrating indices indicating sizes of a recess and a void. FIG. 5 illustrates a recess 111 formed on the surface of a wafer W in which the shape of the recess 111 is indicated by the parameters of an opening width W and a depth D. Further, the void is indicated by the size V of the void (the size of the largest portion of the void).

Figures 6, 7A:
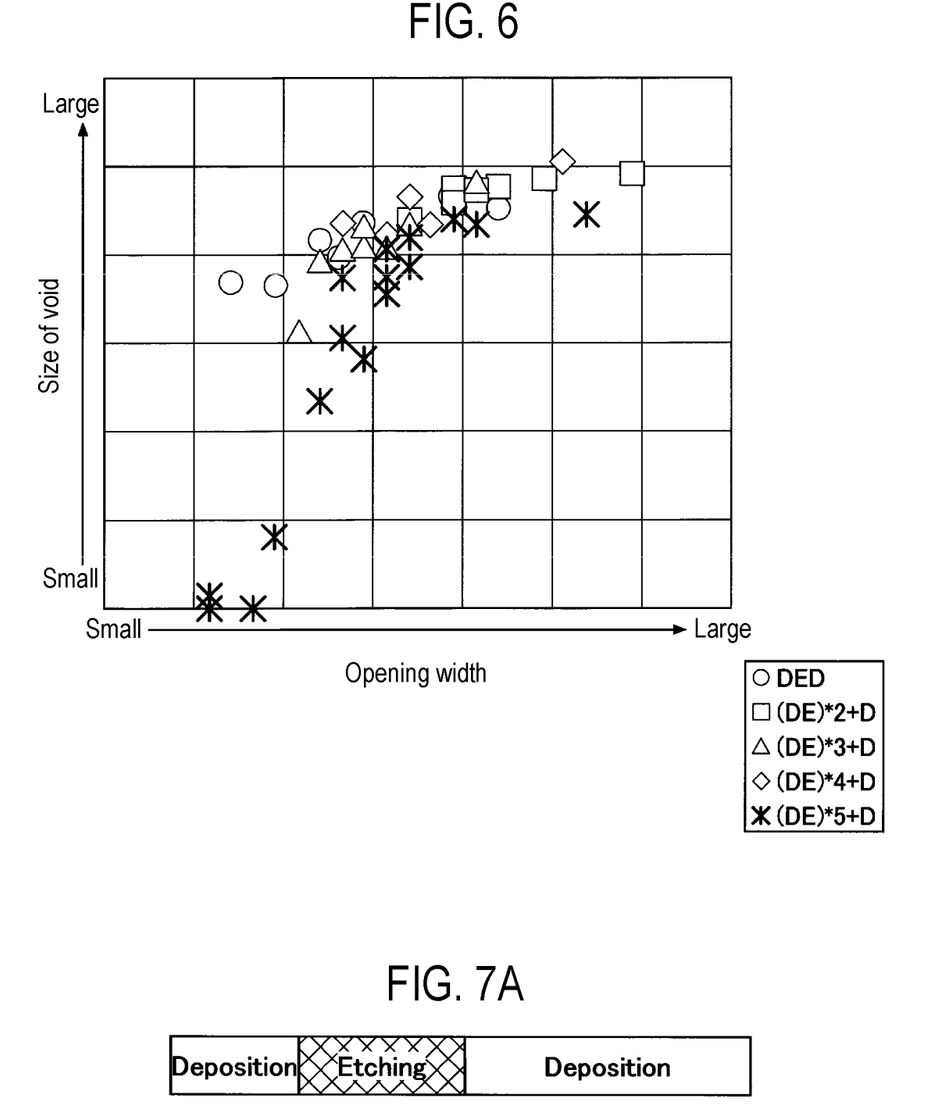
FIG. 6 is a diagram showing filled states obtained by changing the number of times of combined process in which each of film formation and etching is performed once.
FIGS. 7A and 7B are views illustrating sequences of conventional film formation and etching combined processes.

FIG. 6 is a diagram showing filled states obtained by changing the number of combined processes, when assuming that one combined process (one cycle) is a process in which each of film formation and etching is performed once.

In FIG. 6, one combination of film formation and etching is indicated by DE (Deposition, Etching), and the final filling is expressed by D. The process in which DE was repeated twice and film formation was finally performed, the process in which DE was repeated three times and film formation was finally performed, the process in which DE was repeated four times and film formation was finally performed, and the process in which DE was repeated five times and film formation was performed are indicated as (DE)×2+D, (DE)×3+D, (DE)×4+D, and (DE)×5+D, respectively. In the following description, a combined process in which each of film formation and etching is performed once may be abbreviated as a "DE process".

As illustrated in FIG. 6, when the number of DE processes increases, complete filling is obtained in case of a small opening width, but when the opening width increases, complete filling is not obtained even if the number of DE processes increases. That is, with (DE)×5, a recess having a small opening width may be completely filled, but when the opening width is large, complete filling is impossible even with (DE)×5.

This indicates that recesses having an opening width greater than a certain value, that is, recesses having a small aspect ratio, are difficult to fill even if the DE process is repeated.

FIGS. 7A and 7B are views illustrating sequences of conventional film formation and etching combined processes. FIG. 7A illustrates the simplest DE process in which each of film formation (filling) and etching is performed once. This is a process which is completed by performing the DE process once and finally performing filling.

Figure 7B:
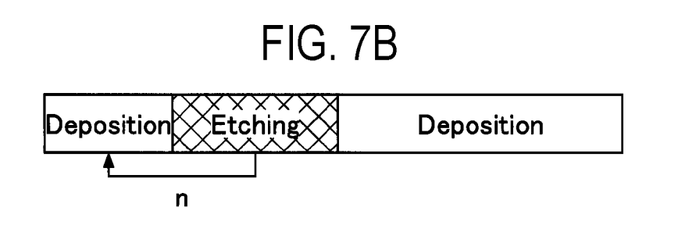

FIG. 7B illustrates a process in which the same DE process is performed n times. The filling process is completed by repeating the same DE process multiple times and finally performing filling. As described with reference to FIG. 6, by performing such a repeated process, a recess having a high aspect ratio may be filled, but it is difficult to completely fill a recess having a low aspect ratio.

First Embodiment

Figure 8:
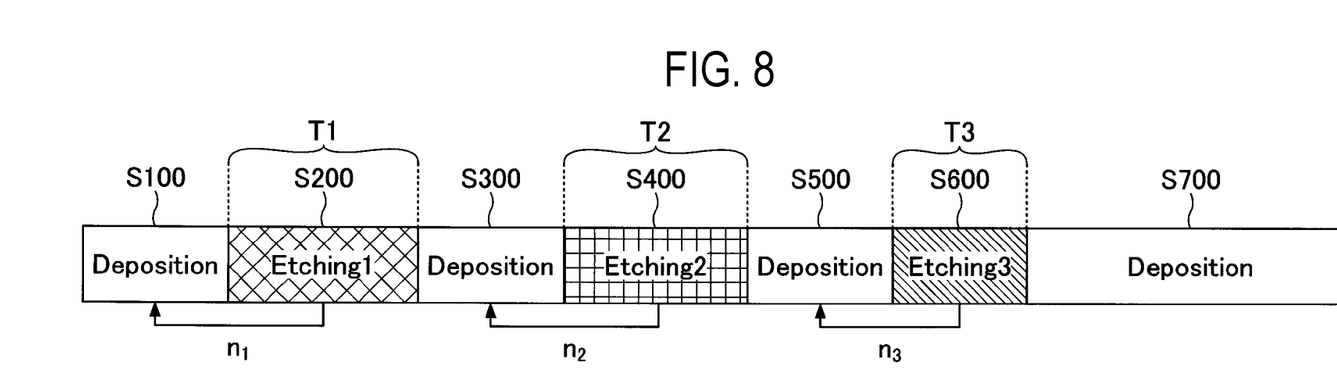
FIG. 8 is a sequence diagram illustrating an example of a recess filling method according to an embodiment of the present disclosure.

FIG. 8 is a sequence diagram illustrating an example of a recess filling method according to a first embodiment of the present disclosure. Hereinafter, the contents of performing a sequence representing an example of a filling method according to the present embodiment illustrated in FIG. 8 by using the substrate processing apparatus described with reference to FIG. 1 will be described.

First, a wafer W is carried into the processing container 1. For carry-in of the wafer, the carry-in/out port 11 is opened by the gate valve 12, and the wafer W is carried into the processing container 1 by a transport robot arm (not illustrated).

The wafer support pins 27 are raised to support the wafer W, and the wafer support pins 27 are lowered to place the wafer W on the stage 2. The gate valve 12 is closed after the transport robot arm exits.

A case where a SiN film is filled in a recess will be described as an example. The filling is performed, for example, by plasma-enhanced atomic layer deposition (PE-ALD). The PE-ALD process is a process for forming a SiN film having a desired film thickness in a recess on a wafer W by repeating a precursor gas supply process, a purge process, a reaction gas supply process, a plasmatizing process, and a purge process by predetermined cycles to alternately supply a precursor gas and a reaction gas. As for the recesses, the recesses 102 and 104 in FIGS. 3A to 3D, in which examples of three types of aspect ratios and opening widths are illustrated, will be described as an example.

Step S100 in FIG. 8 is a first film formation process (filling process). Details of the film formation process in step S100 will be described below. In addition, regarding the recesses, the precursor gas supply process is a process of supplying a precursor gas to the recesses 102 and 104 of the wafer W. In the precursor gas supply process, first, Ar gas is supplied from the Ar gas sources 53a and 54a through the gas supply lines 53b and 54b in a state in which the valves 53e and 54e are opened. In addition, by opening the valve 51e, the precursor gas is supplied to the processing space 38 in the processing container 1 from the precursor gas source 51a via the gas supply line 51b. As a result, the precursor is adsorbed on the surface of the wafer W, and an adsorption layer of the precursor is formed on the surface of the wafer W.

The purge process is a process of purging the wafer W. In the purge process, the valve 51e is closed to stop the supply of the precursor gas in a state in which the supply of Ar gas via the gas supply lines 53b and 54b is continued. As a result, Ar gas is supplied to the processing space 38 in the processing container 1 from the Ar gas sources 53a and 54a via the gas supply lines 53b and 54b. As a result, surplus precursor gas or the like in the processing space 38 is purged.

The reaction gas supply process is a process of supplying NH$_3$ gas as a reaction gas. In the reaction gas supply process, the valve 52e is opened in a state in which the supply of Ar gas through the gas supply lines 53b and 54b is continued. As a result, the reaction gas is supplied to the processing space 38 from the reaction gas source 52a to the processing space 38 via the gas supply line 52b.

The plasmatizing process is a process of plasma-exciting the NH$_3$ gas supplied as the reaction gas. In the plasmatizing process, plasma is generated in the processing space 38 by applying RF to the upper electrode by the radio-frequency power source 83 in a state in which the supply of the Ar gas through the gas supply lines 53b and 54b and the supply of the reaction gas via the gas supply line 52b are continued. As a result, the adsorption layers in the recesses 102 and 104 on the surface of the wafer W are nitrided to form SiN films.

The purge process is a process of purging a surplus reaction gas and the like in the processing space 38. In the purge process, the valve 52e is closed to stop the supply of the reaction gas in a state in which the supply of Ar gas through the gas supply lines 53b and 54b is continued. In addition, the radio-frequency power source 83 stops applying RF to the upper electrode. As a result, Ar gas is supplied to the processing space 38 in the processing container 1 from the Ar gas sources 53a and 54a via the gas supply lines 53b and 54b. As a result, the surplus reaction gas or the like in the processing space 38 is purged.

By repeating the above cycle, a SiN film is filled in the recesses 102 and 104 formed on the surface of the wafer W.

These processes are performed by controlling respective components of the substrate processing apparatus by the controller 9.

Next, the first etching process in step S200 will be described.

The etching process includes a gas lamp process, a gas stabilization process, an etching gas supply process, a plasmatizing process, an etching gas stop process, and a purge process.

In the gas lamp process, by opening the valve 56e, Ar gas is supplied from the Ar gas source 56a to the processing space 38 in the processing container 1 via the gas supply line 56b.

In the gas stabilization process, the Ar gas supplied to the processing space 38 is stabilized in a state in which the supply of Ar gas through the gas supply line 56b is continued.

In the etching gas supply process, in a state in which the supply of Ar gas through the gas supply line 56b is continued, by opening the valve 55e, an etching gas (e.g., NF$_3$ gas) is supplied from the etching gas source 55a to the processing space 38 in the processing container 1 via the gas supply line 55b.

In the plasmatizing process, plasma is generated in the processing space 38 by applying RF to the upper electrode by the radio-frequency power source 83 in a state in which the supply of Ar gas through the gas supply line 56b and the supply of the etching gas through the gas supply line 55b are continued. As a result, the SiN film of the wafer W is etched.

In the etching gas stop process, the supply of the etching gas is stopped by closing the valve 55e in a state in which the supply of Ar gas through the gas supply line 56b is continued. In addition, the radio-frequency power source 83 stops applying RF to the upper electrode. As a result, the etching gas in the processing space 38 is exhausted to the exhauster 4.

In the purge process, the valve 56e is closed to stop the supply of Ar gas. As a result, the gas in the processing space 38 is exhausted to the exhauster 4 and the pressure in the processing space 38 is reduced.

By performing the above-described processing, the SiN film filled in the recesses 102 and 104 is etched. This can make the SiN film into a shape having a V-shaped opening as illustrated in FIG. 3D.

The first film formation process in step S100 and a first etching process in step S200 are repeated $n_1$ times. The etching time in the first etching process at this time is assumed to be T1. The etching time T1 is set to a condition suitable for filling the recess 102 having the highest aspect ratio.

As described with reference to FIG. 6, the recess 102 having a high aspect ratio can be reliably filled by repeating the DE process. In steps S100 and S200, among the recesses 102 and 104 formed on the surface of the wafer W, the recess 102 having the highest aspect ratio and the narrowest opening is filled with a SiN film. The DE process in steps S100 and S200 is repeated until the recess 102 having the highest aspect ratio is filled with the SiN film. The number of times is $n_1$ times.

Next, the second film formation process in step S300 and the second etching process in step S400 are repeated $n_2$ times. The detailed sequence of the second film formation process in step S300 and the second etching process in step S400 are the same as those of the first film formation process in step S100 and the etching process in step S200. However, at this time, the etching process in step S400 is set to an etching time T2 suitable for filling the recess having the second highest aspect ratio and narrowest opening.

Next, the third film formation process in step S500 and the third etching process in step S600 are repeated $n_3$ times. The detailed sequence of the third film formation process in step S500 and the third etching process in step S600 are the same as those of the first film formation process in step S100 and the etching process in step S200. However, at this time, the etching process in step S600 is set to an etching time T3 suitable for filling the recess having the third highest aspect ratio and narrowest opening.

The etching time T2 is set to be shorter than the etching time T1. By setting the etching time T2 to be shorter than the etching time T1, the etching amount in the second etching process can be made to be smaller than the etching amount in the first etching process. The etching time T3 is set to be shorter than the etching time T2. By setting the etching time T3 to be shorter than the etching time T2, the etching amount in the third etching process can be made to be smaller than the etching amount in the second etching process. As described with reference to FIGS. 3A to 3D, when etching is performed with the same etching amount, the film 125 filled in the recess 104 having a low aspect ratio is etched first. That is, in order to fill the recess 104 having a low aspect ratio and a wide opening width, it is necessary to perform the DE process with a small etching amount.

For this reason, in the recess filling method according to the present embodiment, a filling method in which a filling targeting the recess 102 having the highest aspect ratio is firstly performed, subsequently the recess having the second highest aspect ratio becomes a filling target, and finally the recess 104 having the lowest aspect ratio becomes a filling target, is adopted.

In step S700, the final film formation process is performed. This process is a process for filling the recess having the lowest aspect ratio, and the film formation process is performed for the time required for that purpose.

In the first DE process in steps S100 and S200, when performing the first etching process, the etching time is set such that etching does not reach the bottom surface of the recess 104 having the lowest aspect ratio. This becomes a condition limiting the etching amount in the recess filling method according to the present embodiment. In the first etching process, since the recess 102 having the highest aspect ratio is targeted for filling, it is necessary to increase the etching amount. However, when etching reaches the bottom surface of the recess having the lowest aspect ratio, the pattern of the recess 104 is damaged. Therefore, the etching amount is set high within a range in which etching does not reach the bottom surface of the recess 104.

Parameters for controlling the etching amount include RF power, etching gas concentration, substrate temperature, pressure in the processing container 1, and the like.

The RF power is the output of the RF power supply 8, and the energy of the plasmatized etching gas can be controlled by changing the output of the RF power supply 8. That is, the output of the RF power supply 8 may be set to high at first and may be lowered as a recess having a lower aspect ratio is targeted for filling. As a result, the etching amount in the etching process in the DE process can be controlled.

The etching gas concentration is the concentration of the etching gas, and the etching amount can be reduced by lowering the concentration. Therefore, the etching gas may be set to a high concentration at first, the concentration of the etching gas may be lowered as a recess having a lower aspect ratio is targeted for filling. As a result, the etching amount in the etching process in the DE process can be controlled. However, when the plasma state changes due to fluctuations in the concentration of the etching gas, a control considering the magnitude relationship of an etching rate is necessary without being limited thereto.

The substrate temperature is the temperature of the wafer W and may be considered as the set temperature of the heater 21 that heats the wafer W. Since the temperature dependence of the etching amount differs depending on the material of a film and the type of an etching gas, it is necessary to change the control method depending on the process to be performed. For example, when the etching amount increases as the substrate temperature is higher, the set temperature of the heater 21 may be set to a high temperature and may be lowered as a recess having a lower aspect ratio is targeted for filling. As a result, the etching amount in the etching process in the DE process can be controlled.

The higher the pressure in the processing container 1, the greater the flux of the etching gas and the greater the etching amount. Therefore, the set pressure in the processing container 1 may be set to a relatively high pressure at first, and the set pressure in the processing container 1 may be lowered as a recess having a lower aspect ratio is targeted for filling. Specifically, the pressure in the processing container 1 is lowered by increasing the exhaust amount of the exhaust mechanism 42. As a result, the etching amount in the etching process in the DE process can be controlled. However, when the stability of plasma changes due to fluctuations in pressure, a control considering the magnitude relationship of the etching rate is necessary without being limited thereto.

For these controls, the controller 9 may issue commands to respective components to set specific conditions.

Once the recess 102 is filled, the filled film will not be cut out to the bottom in the filling of the next recess. It is necessary to set a long etching time in order to cut a film having a high aspect ratio. However, since the etching time is gradually shortened, the remaining amount of the film in the once-filled recess 102 does not fall below the remaining amount of the film in the next recess.

On the other hand, the recesses 104 having a low aspect ratio cannot be filled first. When trying to fill the recess 102 having a high aspect ratio after filling the recess 104 having a low aspect ratio, the filling of the recess 104 having the low aspect ratio does not progress since the etching amount is large.

With the recess filling method according to the first embodiment, the recesses 102 and 104 having different aspect ratios can be filled in order from a high aspect ratio, so all the recesses can be filled without a void.

Second Embodiment

Figure 9:
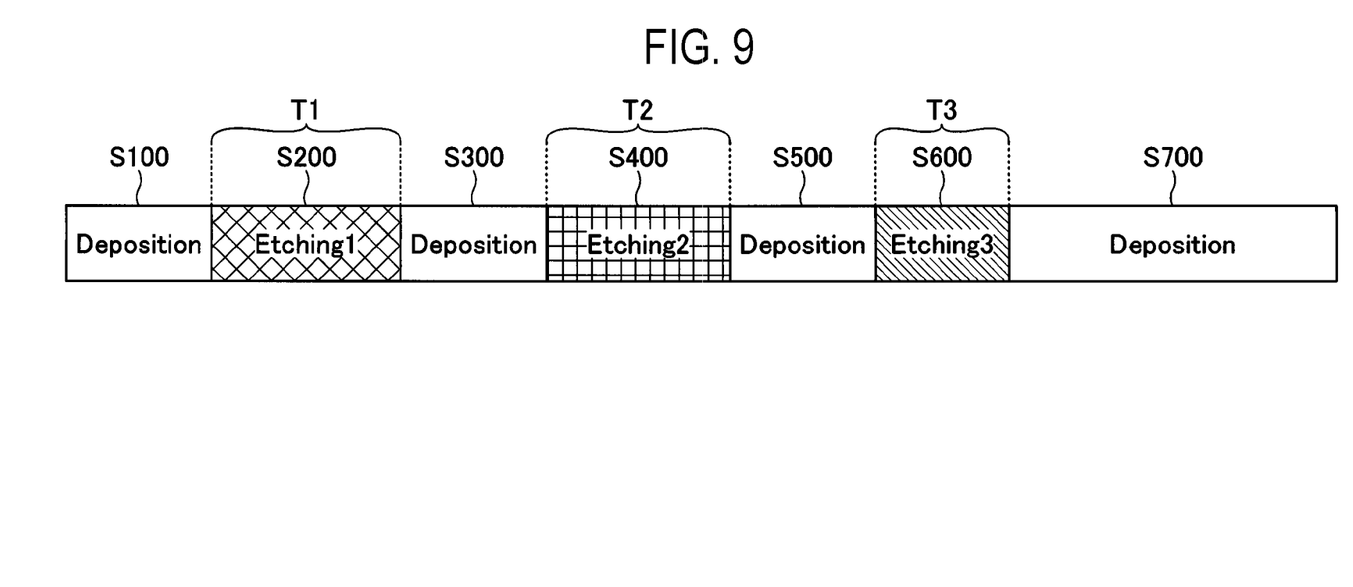
FIG. 9 is a sequence diagram illustrating an example of a recess filling method according to an embodiment of the present disclosure.

FIG. 9 is a sequence diagram illustrating an example of a recess filling method according to a second embodiment of the present disclosure.

As illustrated in FIG. 9, the repetition of $n_1$ to $n_3$ is eliminated in the recess filling method according to the second embodiment. Instead of repeating steps S100 and S200 in a loop or cycle, a sequence may be adopted in which the etching time is gradually shortened each time. The degree of shortening of the etching times T1 to T3 in this case is preferably smaller than the sequence in the recess filling method according to the first embodiment. In the entire sequence, it is only necessary that the sequence is set such that all of the recesses from the recess 102 having the highest aspect ratio to the recess 104 having the lowest aspect ratio can be filled.

In addition, regarding the film formation process, the film formation conditions may be constant or may be changed. As described with reference to FIGS. 3A to 3D, in the DE process, etching has a greater effect on the shape of the filled film than film formation, but it is possible to contribute to the control of filling by changing the conditions for the film formation process. However, if parameters are moved for both etching and film formation, the control becomes complicated. Therefore, from the viewpoint of control, it is preferable to keep the film formation conditions constant and control the parameters by the etching conditions.

In the first and second embodiments, an example in which the etching amount is controlled by the etching time has been described, but when the etching amount is controlled by another parameter, the etching time is made equal in each DE process, and the etching amount is controlled by a selected parameter. Thus, these embodiments may be similar to the prior art in sequence diagram but are different from the prior art in the features of etching.

It is also possible to combine control parameters, such as controlling etching conditions by parameters other than the etching time and adding the etching time thereto as a parameter.

In this case, the correlation between setting conditions and conditions for filling recesses is determined in advance, and appropriate control conditions may be set depending on aspect ratios.

In this manner, by changing the etching amount stepwise from large to small, the recesses can be voidlessly filled in order from a recess having a high aspect ratio to a recess having a low aspect ratio.

The etching time may be changed to the etching amount in concept, while other parameters may be changed to the etching rate. That is, in the case where the etching amount is controlled by the etching time, the etching rate is constant, but in the case where the etching amount is controlled by different RF power or gas concentration, the etching rate is changed while the etching time becomes constant. Thus, the two cases are slightly different in nature. Broadly speaking, the etching amount becomes a control parameter.

In the first and second embodiments, the three processes of the first DE process, the second DE process, and the third DE process have been described, but the present disclosure is not limited thereto. For example, two processes of the first DE process and the second DE process may be used, or three or more processes may be combined as long as recesses having different aspect ratios formed on a substrate can be filled. That is, it is sufficient that recesses having different aspect ratios can be filled by combining the first to $n_{th}$ DE processes. In addition, from the viewpoint of filling recesses having different aspect ratios, it is sufficient that the recesses can be filled by performing two processes of the first DE process and the second DE process.

Examples

Next, an example in which the recess filling method according to the first embodiment is performed will be described.

Figure 10A:
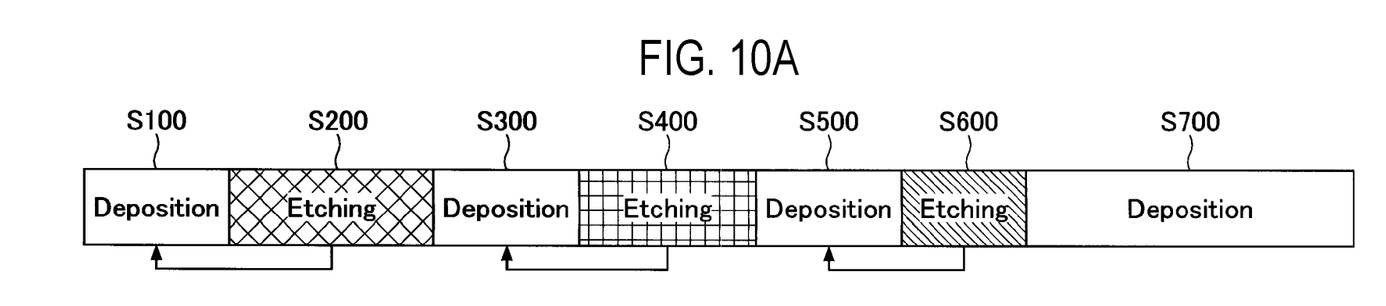
FIGS. 10A and 10B are views for explaining a recess filling method according to an example and a recess filling method according to a comparative example.
Figure 10B:
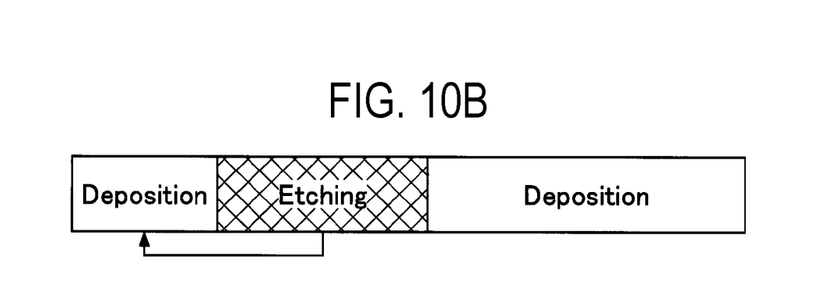

FIGS. 10A and 10B are views for explaining a recess filling method according to an example and a recess filling method according to a comparative example, respectively.

FIG. 10A is a view illustrating a sequence of the recess filling method according to the example. As illustrated in FIG. 10A, the first DE process, the second DE process, and the third DE process were all repeated five times. In addition, the etching time was gradually shortened in the order of the first DE process>the second DE process>the third DE process.

FIG. 10B is a view illustrating a sequence of the recess filling method according to the comparative example. As illustrated in FIG. 10B, the etching time was fixed to the same time as the etching time of the first DE process of the example, and the DE process of film formation and etching were repeated five times.

Figure 11:
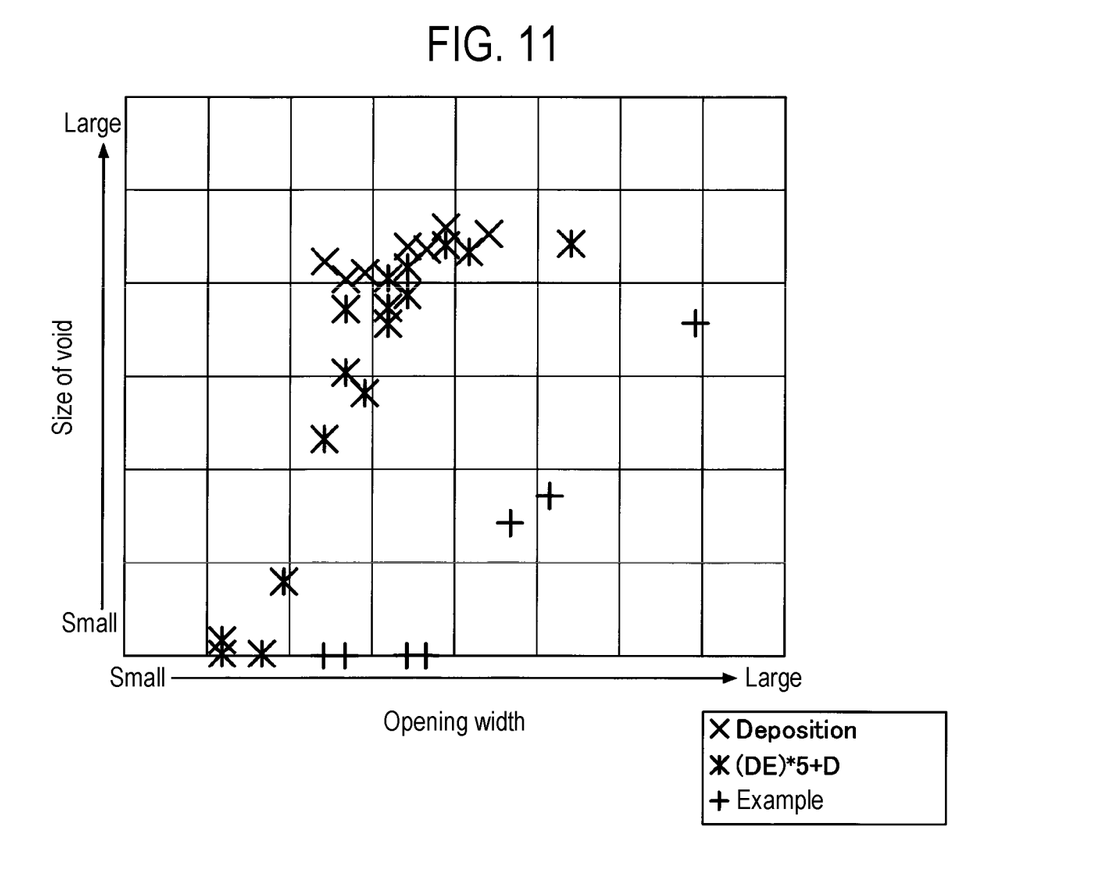
FIG. 11 is a diagram showing results of execution of the recess filling methods according to the example and the comparative example.

FIG. 11 is a diagram showing the results of execution of the recess filling methods according to the example and the comparative example. In FIG. 11, the horizontal axis represents an opening width, and the vertical axis represents void size. As shown in FIG. 11, with the recess filling method according to the example, a recess having a wide opening width, i.e., a low aspect ratio can be filled. Although this is an example with limited conditions, when the optimum conditions are determined in an actual process, it becomes possible to completely fill a recess having a wider opening width.

In contrast, with the recess filling method according to the comparative example, it can be seen that a recess having a narrow opening width, i.e., a high aspect ratio can be filled, but when the opening is widened, the void increases, making the filling difficult.

As described above, it was shown that the recess filling method according to the example enables voidless filling even in a recess having a wide opening width, i.e., a low aspect ratio.

Although embodiments and examples of the present disclosure have been described in detail above, the present disclosure is not limited to the above-described embodiments and examples, and various modifications and substitutions can be added to the above-described embodiments and examples without departing from the scope of the present disclosure.

This application claims the priority of basic application No. 2020-161800 filed with the Japanese Patent Office on Sep. 28, 2020, the disclosure of which is incorporated herein in its entirety by reference.

EXPLANATION OF REFERENCE NUMERALS

W: wafer, 1: processing container, 2: stage, 3: shower head, 4: exhauster, 9: controller, 5, 6: gas supply mechanism, 51a: precursor gas source, 52a: reaction gas source, 53a: Ar gas source, 54a: Ar gas source, 55a: etching gas source, 56a: Ar gas source, 8: RF power supply (radio-frequency power supply), 83: radio-frequency power source, 100 to 111: recess, 120 to 125: film

What is claimed is:

1. A recess filling method comprising:
a combined process comprising a film formation process of forming a film in recesses formed on a surface of a substrate and having different aspect ratios and an etching process of etching the film formed in the recesses; and
a repetition process of repeating the combined process n times (n is a natural number of 2 or more),
wherein the repetition process comprises:
a first combined process of performing the etching process with a first etching amount suitable for filing, with the film, a first recess having a first aspect ratio; and
a second combined process of performing the etching process with a second etching amount that is smaller than the first etching amount and is suitable for filing, with the film, a second recess having a second aspect ratio smaller than the first aspect ratio, wherein the second combined process is performed after the first combined process.

2. The recess filling method of claim 1, wherein the first combined process comprises repeating the combined process multiple times.

3. The recess filling method of claim 2, wherein the second combined process comprises repeating the combined process multiple times.

4. The recess filling method of claim 3, wherein the repetition process further comprises a third combined process of performing the etching process with a third etching amount that is suitable for filing, with the film, a third recess having a third aspect ratio lower than the second aspect ratio, wherein the third combined process is performed after the second combined process.

5. The recess filling method of claim 4, wherein the third combined process comprises repeating the combined process multiple times.

6. The recess filling method of claim 5, wherein reduction of the second etching amount is implemented by at least one selected from a group consisting of: reducing etching time; reducing an output of a radio-frequency power source configured to plasmatize an etching gas; reducing a concentration of the etching gas; reducing a temperature of the substrate; and
reducing a pressure in a processing container in which the etching process is performed.

7. The recess filling method of claim 6, wherein the etching process comprises a process of etching the film formed in the recesses by activating a halogen gas.

8. The recess filling method of claim 7, wherein the halogen gas is activated by heat or plasma.

9. The recess filling method of claim 8, wherein film forming conditions in film formation processes are all equal to each other in the repetition process.

10. The recess filling method of claim 9, wherein the repetition process comprises the combined process in which film formation conditions for film formation processes are different.

11. The recess filling method of claim 10, wherein the film filled in the recesses is one of an insulating film, a dielectric film, and a metal-containing film.

12. The recess filling method of claim 11, wherein the film filled in the recesses is a silicon nitride film.

13. The recess filling method of claim 1, wherein the second combined process comprises repeating the combined process multiple times.

14. The recess filling method of claim 1, wherein the repetition process further comprises a third combined process of performing the etching process with a third etching amount that is suitable for filing, with the film, a third recess having a third aspect ratio lower than the second aspect ratio, wherein the third combined process is performed after the second combined process.

15. The recess filling method of claim 1, wherein the recesses having different aspect ratios have m (m is a natural number of 2 or more and n or less) aspect ratios, and wherein the repetition process comprises an $m^{th}$ combined process of performing the etching process with an $m^{th}$ etching amount that is smaller than an $(m-1)^{th}$ etching amount in an $(m-1)^{th}$ combined process and is suitable for filling, with the film, an $m^{th}$ recess having an $m^{th}$ aspect ratio lower than an $(m-1)^{th}$ aspect ratio, wherein the etching process in the $m^{th}$ combined process is performed after the $(m-1)^{th}$ combined process.

16. The recess filling method of claim 15, wherein the $m^{th}$ combined process comprises repeating the combined process multiple times.

17. The recess filling method of claim 16, further comprising:
a post-processing process of performing film formation after the repetition process of repeating the combined process n times.

18. The recess filling method of claim 4, wherein reduction of the third etching amount is implemented by at least one selected from a group consisting of: reducing etching time; reducing an output of a radio-frequency power source configured to plasmatize an etching gas; reducing a concentration of the etching gas; reducing a temperature of the substrate; and reducing a pressure in a processing container in which the etching process is performed.

19. The recess filling method of claim 15, wherein reduction of the $n^{th}$ etching amount is implemented by at least one selected from a group consisting of: reducing etching time; reducing an output of a radio-frequency power source configured to plasmatize an etching gas; reducing a concentration of the etching gas; reducing a temperature of the substrate; and reducing a pressure in a processing container in which the etching process is performed.

20. A substrate processing apparatus that fills, with a film, recesses formed on a surface of a substrate and having different aspect ratios, the substrate processing apparatus comprising:
a processing container;
a stage provided in the processing container and configured to support the substrate having a recess formed on a surface thereof;
a film forming part configured to form the film in the recess of the substrate supported by the stage;
an etching part configured to etch the film formed in the recess; and
a controller configured to control the film forming part and the etching part to perform:
a repetition process of performing, n times (n is a natural number of 2 or more), a combined process in which a film formation process performed by the film forming part to form the film in the recesses and an etching process performed by the etching part to etch the film formed in the recess are combined,
wherein the repetition process comprises: a first combined process of performing the combined process under a first etching condition suitable for filling, with the film, a first recess having a first aspect ratio; and a second combined process of performing the combined process under a second etching condition suitable for filling, with the film, a second recess having a second aspect ratio lower than the first aspect ratio.

* * * * *